United States Patent [19]

Lagadec

[11] Patent Number: 4,630,007
[45] Date of Patent: Dec. 16, 1986

[54] DELTA MODULATED SIGNAL SAMPLING RATE CONVERTER USING DIGITAL MEANS

[75] Inventor: Roger Lagadec, Ruemlang, Switzerland

[73] Assignee: Dolby Laboratories Licensing Corporation, San Francisco, Calif.

[21] Appl. No.: 742,883

[22] Filed: Jun. 10, 1985

[30] Foreign Application Priority Data

Jun. 12, 1984 [CH] Switzerland .......................... 2831/84

[51] Int. Cl.⁴ .............................................. H03C 3/00
[52] U.S. Cl. ....................................... 332/1; 332/11 D
[58] Field of Search ......................... 332/1, 9 R, 11 D; 375/27, 28, 33; 455/118, 126

[56] References Cited

U.S. PATENT DOCUMENTS 4,361,893 11/1982 Bonnerot ...................... 332/11 D X
4,411,003 10/1983 Su ........................................... 375/33
4,467,291 8/1984 Roza ................................... 375/28 X

OTHER PUBLICATIONS

Un, C. K., "Voiced/Unvoiced/Silence Discrimination of Speech by Delta Modulation" IEEE Transactions on Acoustics, Speech, and Signal Processing, vol. AS-SP-28, No. 4, Aug. 80, pp. 398–407.

Primary Examiner—Eugene R. LaRoche
Assistant Examiner—D. C. Mis
Attorney, Agent, or Firm—Majestic, Gallagher, Parsons & Siebert

[57] ABSTRACT

In the conversion of a first delta modulated signal with a first bit rate into a second delta modulated signal with a second bit rate, a first and second digital signal derived respectively from the first and second delta modulated signals are compared together in an adding circuit (58) followed by an integration circuit (55). In this way an analog intermediary signal can be avoided and the circuit complexity is small.

23 Claims, 6 Drawing Figures

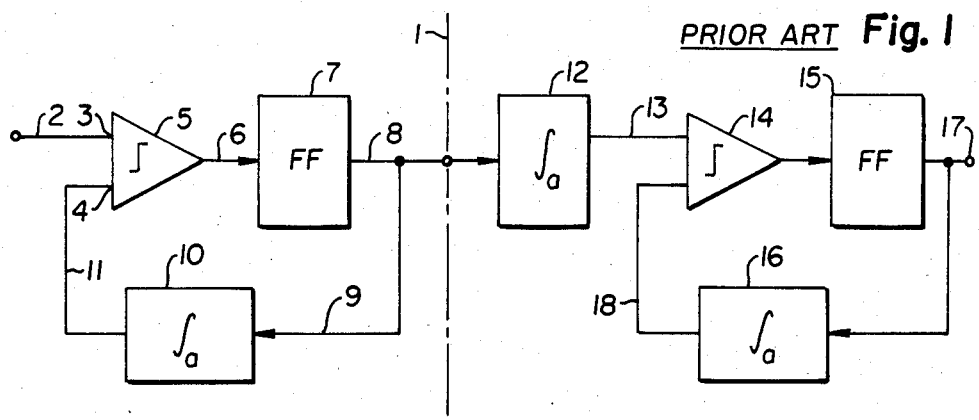
PRIOR ART Fig. 1
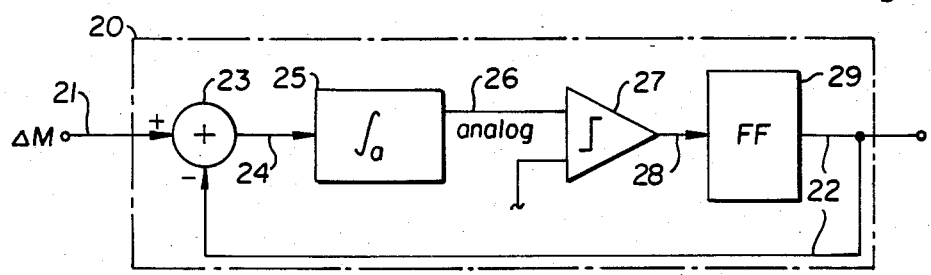
Fig. 2
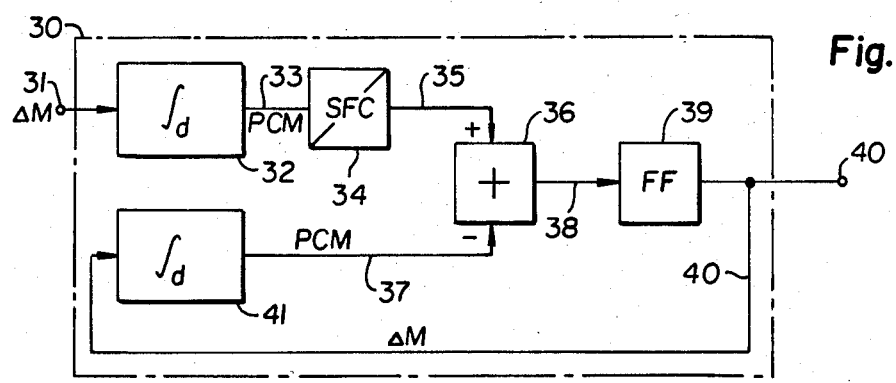
Fig. 3
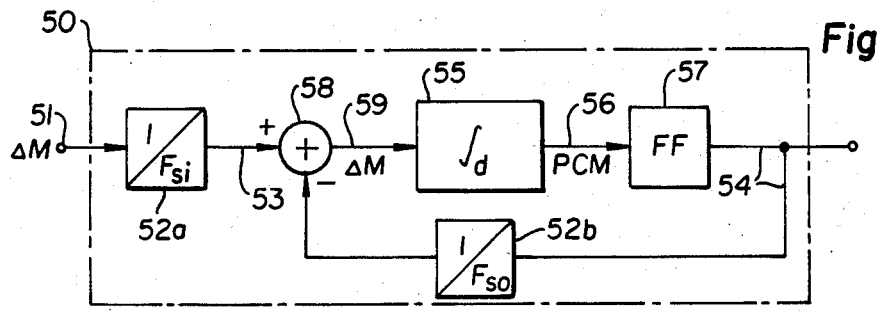
Fig. 4

4,630,007

DELTA MODULATED SIGNAL SAMPLING RATE CONVERTER USING DIGITAL MEANS

BACKGROUND OF THE INVENTION

The invention concerns a method as well as an apparatus for converting from a first delta modulation signal with a first bit rate into a second delta modulated signal with a second bit rate.

Methods and apparatus for converting analog signals into delta modulated signals are well known. However, there are no large systems in operation which are based upon delta modulation apart from limited applications as for example in military communications. Additionally several proposals have been made for using delta modulated signals in digital audio. Until now digital audio has always been based on the pulse code modulation (PCM) with its relatively high hardware complexity. In the case of PCM systems, the problem of converting signals from one sampling rate into signals with another sampling rate has been solved and has led to more or less complex solutions. (In delta modulation, one speaks of a bit rate rather than a sampling rate.) The solutions are particularly complex when both sampling rates are not in an integer and constant ratio. Finally, the conversion from signals in delta modulated form into PCM signals and back is known today but restricted to the case of very simple relationships between the two frequencies.

Until now there is no proposal for a circuit which converts delta modulated signals from one arbitrary bit rate into another arbitrary bit rate. Naturally there is always the possibility of implementing the conversion from delta modulated form to delta modulated form with arbitrary bit rates as well as the conversion between delta modulation form and PCM form and vice-versa via the analog domain. Such solutions, however, lead to complex circuitry and are not economical. As described below, state of the art circuits implementing the conversion via the analog domain may require the use of two integrators with identical or almost identical frequency response, which is expensive. Additionally, conversion implemented via the analog domain does not offer the reproducibility of purely digital methods.

SUMMARY OF THE INVENTION

The invention, as stated in the following claims, solves the problem of offering economic circuitry for converting the first delta modulated signal into a second delta modulated signal with arbitrary bit rates. The preferred embodiment of the invention is entirely digital and requires no analog intermediary signal.

The system of this invention converts a first delta modulated signal at a first bit rate into a second delta modulated signal at a second bit rate. The system includes an adding circuit for providing the difference signal between a first and a second digital signal which are respectively, or are derived from respectively, the first and the second delta modulated signals. The system also includes means for deriving the second delta modulated signal from the difference signal. In the preferred embodiment, the deriving means integrates and quantizes the difference signal to provide the second delta modulated signal, which is then fed back to the adding circuit through a negative feedback loop.

In the preferred embodiment, the first delta modulated signal is first weighted according to the second bit rate and converted into a delta modulated signal at the second bit rate before it is applied to the adding circuit, which subtracts from such signal the second delta modulated signal to provide the delta modulated difference signal. Alternatively, the first and second delta modulated signals may be directly applied to the adding circuit, which weights and subtracts the two delta modulated signals with different bit rates.

In the preferred embodiment, the difference signal is integrated by a digital integrator and quantized to provide the second delta modulated signal at the second bit rate. Alternatively, the difference signal may be integrated by an analog integrator to provide an analog intermediary signal, which is compared to a preset signal level and sampled at the second bit rate to provide the second delta modulated signal at the second bit rate.

One of the main advantages of this invention is that the conversion of delta modulated signals remains simple even in the cases where the bit rate ratios are not integer. Circuits based on this invention can also be used for conversion between a delta modulated signal and a PCM signal and vice-versa with arbitrary relationships between the clocks. The conversion occurs via a delta modulated signal with a bit rate in a simple integer relationship to the sampling rate of the PCM signal. In other types of signal representation, as for instance described in the paper by C. Todd and K. Gundry: "A Digital Audio System for Broadcast and Pre-Recorded Media", Preprint No. 2071 (C7), Audio Engineering Society, signals which were originally in analog or PCM form are represented by a plurality of delta modulated signals. The bit rate conversion and the flexible conversion from an arbitrary PCM signal is particularly complex in those multiple delta modulated signals but can be simplified by making use of the invention.

BRIEF DESCRIPTION OF THE DRAWINGS

FIG. 1 is a block diagram of a circuit for converting an analog signal into a delta modulated signal and an apparatus for converting a delta modulated signal of one bit rate to another of a different bit rate according to the state of the art.

FIG. 2 is a block diagram of an apparatus for converting a delta modulated signal of one bit rate to another of a different bit rate illustrating a first alternative embodiment of the invention.

FIG. 3 is a block diagram of an apparatus for converting a delta modulated signal of one bit rate to another of a different bit rate illustrating a second alternative embodiment of the invention.

FIG. 4 is a block diagram of an apparatus for converting a delta modulated signal of one bit rate to another of a different bit rate illustrating the preferred embodiment of the invention.

DETAILED DESCRIPTION OF THE PREFERRED EMBODIMENT

Figure 5:
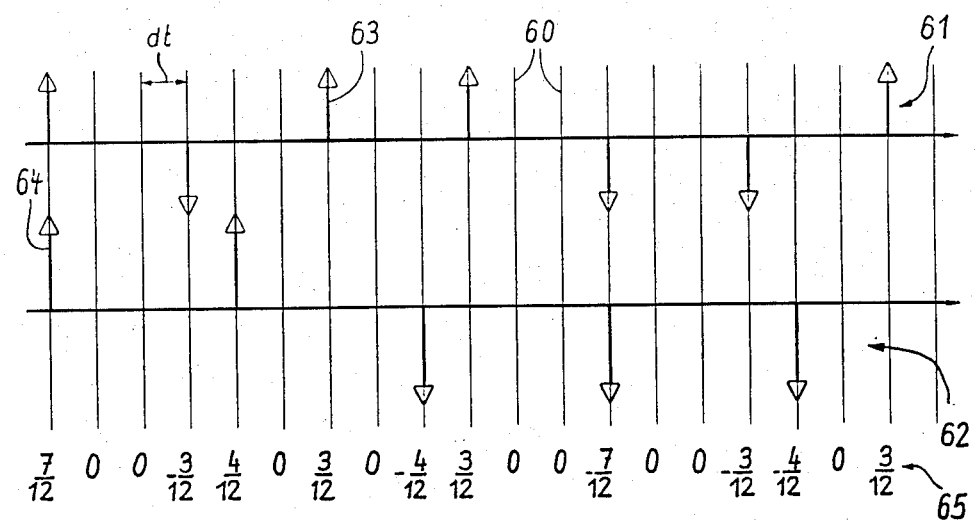
FIGS. 5 and 6 are schematic representations of the conversion of delta modulated signals.

The circuit of FIG. 1, although not necessarily corresponding to an existing implementation, is obvious, based on the state of the art and provides the conversion of an analog signal into a first delta modulated signal with a first bit rate as well as the consecutive conversion back into an analog signal and the consecutive conversion into a second delta modulated signal with a second bit rate. In the first part of the circuit to the left hand side of a division line 1, an analog signal is converted into a first delta modulated signal.

In the second part of the circuit to the right of the division line 1, the first delta modulated signal with the first sampling rate is converted into a second delta modulated signal with a second sampling rate.

an analog signal on line 2 goes to one of the two inputs 3 and 4 of a comparator circuit 5. This comparator circuit compares the signals at both inputs by computing the difference between the signals at inputs 4 and 3, and delivers in 6 a one-bit signal. Depending on whether the difference is positive or negative the value of the output signal on 6 is +1 or −1. This signal enters a sampling and storage element, 7, at given moments in time and remains there until the next value of the signal is entered, which means that the element 7 has a constant output signal at 8 between the appearances of consecutive values of its input signal. On line 8 there is a delta modulated signal in the form of a one bit sequence. This signal feeds an integrator, 10, via line 9, and the integrator converts the one bit sequence into an analog signal which is similar to the input analog signal, this occurring on line 11. This analog signal is compared in 5 with the analog input signal leading to corrective terms on line 6 as discussed above. For this conversion into a delta modulated signal a given but selectable bit rate is used. The bit rate also controls in a well known way the sampling rate of the sampling and storage element 7 and defines the point in time at which the difference between signals at inputs 3 and 4 is sampled and then stored in element 7. Element 7 is normally built in the form of a flip-flop; the flip-flop is then clocked at the selected bit rate.

The delta modulated signal on line 8 subsequently feeds an integrator, 12. The integrator is a well known analog low pass filter. At its output on line 13 we find again an analog signal. If the circuit is of good quality the signals on lines 2 and 13 are very similar. After this comparator 14, storage element 15, and integrator 16 operate in the same way as has been explained before.

In order to obtain an output 17 a delta modulated signal with a different bit rate from that on line 8, the output of comparator 14 must be sampled at a different bit rate than was used in sampling the output of comparator 5. Both integrators, or analog filters 12 and 16 must have the same frequency response in order to produce on lines 18 and 13 similar signals. The requirement for such integrators causes the sampling rate converter of FIG. 1 to be expensive and uneconomical. FIG. 2 shows a signal processing unit 20 which corresponds to the second part of the circuit of FIG. 1 to the right side of the division line 1 as far as the input and the output signals are concerned to illustrate a first alternative embodiment of the invention. Line 21 feeds a first delta modulated signal with a first bit rate to an adding circuit 23 and line 22 leads a second delta modulated signal with a second bit rate to the same adding circuitry 23.

In this adding circuit 23 a weighting operation must take place as the increments represented by the delta modulated pulse are inversely proportional to the bit rate as one knows from the basic theory of delta modulation. Without weighting, conversion would produce a difference in signal amplitude as well, depending on the precise details of the integrating circuit, and to a modification of the frequency response. Therefore adding circuit 23 must be built in such a way that it can subtract the signal on line 22 from the signal on line 21 and deliver on line 24 a signal at a higher frequency and assuming up to nine different possible values.

The higher frequency is caused by the fact that two signals with different bit rates are merged together. The necessary weighting is quite simple and can, for example, be implemented with resistors in a given ratio as is common in analog techniques.

The adding circuit 23 can also be built in a switching mode and connect line 24 alternatingly and in time multiplex with one or the other input signal on lines 21, 22.

An analog filter 25 is fed by line 24. In this filter 25 the signal summed in the adding circuit 23 is converted into a continuous analog signal which can be found on line 26.

The analog signal on line 26 feeds a comparator 27 where it is compared with a given or preset value, for example 0, producing a signal on line 28 feeding a sampling and storage element 29 and the output of which is a second delta modulated signal on line 22. This delta modulated signal has a bit rate corresponding to that controlling the sampling and storage element 29.

A further purely digital implementation form of the sampling rate converter unit 30 can be found in FIG. 3, illustrating a second alternative embodiment of the invention. A first delta modulated signal on input 31 feeds a digital operating integration filter 32. In this filter the first signal is converted into a first PCM signal with a PCM sampling rate equal to the bit rate of the delta modulation or in a simple integer relationship with it. Such filters 32, which are often called Sigma Delta Filters, are well known from technical literature, and have in the digital domain a similar function to that of analog integration filters. Afterwards, the PCM signal on line 33 feeds the sampling frequency converter (SFC) 34. Such sampling rate converters are known, for instance, from European patent application 0052847 or from Swiss patent application 5427830, which are hereby incorporated by reference. The sampling frequency converter 34 converts the PCM signal with the first sampling rate from filter 32 into a PCM signal with a second sampling rate. This second rate corresponds to the sampling rate of a second digital integration filter 41 for converting a delta modulated signal with the bit rate of the delta modulated output signal into a corresponding PCM signal.

Via line 35 the PCM signal corresponding to the first delta modulated signal feeds an adding circuit 36 which also receives the PCM signal corresponding to the second or output delta modulated signal via line 37. The difference between the two PCM signals which operate with the same sampling frequency is computed on line 38 and goes to a sampling and storage element 39 the output 40 of which delivers a delta modulated signal with the second bit rate. Element 39 has the form of a one bit quantizer. The output 40 is also connected to a second digital processing filter 41 which converts the second delta modulated signal into a PCM signal of the same or related bit rate.

The sampling rate converter unit can also be built in such a way that the sampling rate converter 34 follows filter 41 instead of filter 32.

The sampling rate converter unit 30 can be transformed into an equivalent circuit in which the sampling frequency conversion does not occur based on PCM signals but based on delta modulated signals. In that case, as has already been illustrated in FIG. 2 in the analog domain, the two integration filters 32 and 41 which operate at the same sampling or bit rate can be replaced by two digital filters 52a, 52b as seen in FIG. 4.

FIG. 4 shows a last implementation of sampling rate converter unit 50, illustrating the preferred embodiment of the invention. A first delta modulatd signal enters on line 51 the synchronization and weighting circuit 52a. In this unit, signal pulses (this means positive or negative increments entering with a first bit rate) are evaluated in a time domain grid corresponding to the second bit rate and their amplitudes normalized according to the ratio between the bit rates of the input delta modulated signal and the second bit rate. The result on line 53 is a slightly distorted signal, the long term integral of which is similar to the integral of the first delta modulated signal. The output or second delta modulated signal at 54 of the unit 50 is also normalized in a similar manner by the weighting circuit 52b and then fed to the adding circuit 58.

It is possible to eliminate filter 52b if filter 52a is modified to accomplish the function described below. The only filter 52a used evaluates the increments of the first (input) delta modulated signal on a time grid corresponding to the bit rate of the second (output) delta modulated signal and also weights the amplitude of the first delta modulated signal according to the ratio between the bit rates of the first and second delta modulated signals. In the case of bits rates, the ratio of which can be represented as the ratio of two integers, adding circuit 58 can operate in synchronicity with the smallest common multiple frequency. It is important to note that the increments which are represented by the delta modulated pulses at different pulse rates must be represented in this addition operation inversely proportional to their corresponding bit rates. This guarantees a conversion with unit gain as can be derived from the theory of delta modulation. The output signals of adding circuits 58 on line 59 therefore have the values 0, $1/BR_1$, $-1/BR_1$, $1/BR_2$, $-1/BR_2$, $1/BR_1+1/BR_2$, $1/BR_1-1/BR_2$, $-1/BR_1+1/BR_2$, $-1/BR_11/BR_2$, where $BR_1$ represents the first bit rate and $BR_2$ the second bit rate. Either quantity $1/BR_1$ and $1/BR_2$ can be normalized to unity.

Figure 6:
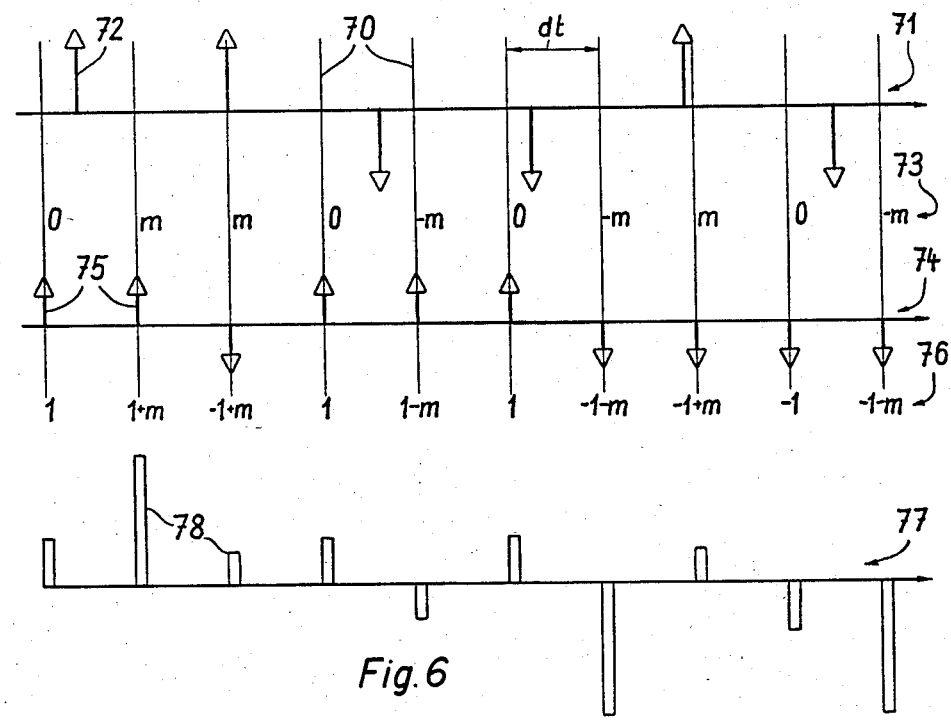

In the case of bit rates with arbitrary, unknown or varying ratios between the bit rates, a common multiple frequency is unknown or can only be derived with complex circuitry. However, it is possible to operate adding circuit 58 at the output bit rate and to place the incoming delta modulation pulses with the input bit rate onto the time grid of the output bit rate as seen in FIGS. 5 and 6. The signal on line 59 feeds the digital filter 55 where it is integrated and feeds via line 56 the sampling and storage element 57 producing on its output 54 the delta modulated signal with a second bit rate. Also in this case the sampling and storage element 57 is a one bit quantizer.

FIGS. 5 and 6 show the function of the adding circuit 23 of FIG. 2. In conventional adding circuits, where subtraction is performed instead of addition, the quantity to be subtracted is multiplied by "−1" and then added to the other quantity from which it is to be subtracted. FIGS. 5 and 6 show the function of the adding circuit 23 in adding the input delta modulated signal to the feedback signal after the feedback signal has been multiplied by "−1". Obviously, other types of adding circuits may be used to perform subtractions and are also within the scope of this invention.

FIG. 5 shows the function of the adding circuit 23, FIG. 2, for two different bit rates, the ratio of which can be represented as the arithmetic ratio of 2 integers.

Lines 60 define a time unit dt as the distance between two consecutive lines 60 corresponding to the smallest common multiple frequency of a first delta modulated signal 61 and a second delta modulated signal 62. The increments represented by arrow 63 for the first signal 61, and by arrow 64 for the second signal 62, have amplitudes inversely proportional to their corresponding bit rates. Signal 61 has a bit rate corresponding to three time units dt and increments represented by the length of arrows 63, which for instance have been normalized to one. Signal 62 has a lower bit rate corresponding to four time units dt and therefore increments of fourthirds. During addition, after each interval dt, the sum of the increments having occurred over this interval dt on both signals 61 and 62 would be calculated. This is illustrated by the sequence of numbers 65 which represents the signal on line 24 in FIG. 2.

In FIG. 6 the function of the adding circuit 23 for two different bit rates in an arbitrary ratio is represented on a time grid defined by lines 70 which correspond to the bit rate or sampling rate of the output (second delta modulated) signal. An input (first delta modulated) signal 71 represented by arrow 72 has an amplitude given by "m" and by ± directions. The sequence of measured values 73 carries the measured values at the end of each time interval dt. An output signal 74 with normalized amplitude of the increments given by arrows 75 corresponds to a delta modulated signal operating with a frequency corresponding to the time grid. The addition of both signals 71 and 74 is represented by the sequence of values 76 and by the pulses 78 of a signal 77. Signal 77 can be found on line 24.

The principle of this conversion in adding circuit 23, therefore, consists in that during the output time interval the input bit is registered. If there has been no input bit or increment during this interval the signal with value "0" will be delivered synchronously with the output bit rate. This produces both an adjustment of the bit rate and a preservation of the spectral content of the signals at low frequencies as is required in delta modulation. The signal processed in such a way is no longer a delta modulated signal in the strict sense as it can assume a number of values rather than just two. But this is of no importance for the technical implementation of the circuitry.

The operation of adding circuits 36 and 58 is simpler, as they both operate with signals with the same bit rate. When a delta modulated signal 71, as seen in FIG. 6, enters the synchronization circuitry 52a (modified to evaluate the input delta modulated signal in the time domain grid of the output delta modulated signal bit rate, and the amplitude of the input signal weighted accordingly) there will be at the output, on line 53, a signal corresponding to the sequence of values 73 with numerical value "0", "m" and "−m" synchronously with the output bit rate. The output signal 74 (on line 54) will therefore be added to the sequence of values 73 (without being filtered by filter 52b) in adding circuit 58 leading on line 59 to a sequence of values 76 or a signal 77.

From the above description, it will be evident that the adding circuit 23 of FIG. 2 is equivalent to the adding circuit 58 together with filters 52a, 52b of FIG. 4, and to the adding circuit 58 with only filter 52a but no filter 52b where filter 52a has been modified to evaluate in accordance to the bit rate of the output delta modulated signal. The output signal in line 24 is similar to that in line 59 given the same input delta modulated signal at 21, 51 and the same bit rate for the output delta modulated signal. It will also be evident that digital filter 55 of FIG. 4 is equivalent to analog filter 25 together with comparator 27 of FIG. 2; the only difference being that using a digital filter 55 eliminates any intermediary analog signal so that the entire sampling rate converter circuit of FIG. 4 is digital with all the attendant advantages described above.

The above description of circuit implementation and method is merely illustrative thereof and various changes in arrangements or other details of the method and implementation may be within the scope of the appended claims.

I claim:

1. A method for converting a first delta modulated signal with a first bit rate into a second delta modulated signal with a second bit rate comprising:
   providing a difference signal by subtractively combining a first and a second digital signal, wherein the first digital signal is, or is derived from, the first delta modulated signal and wherein the second digital signal is, or is derived from, the second delta modulated signal; and
   deriving the second delta modulated signal from the difference signal.

2. The method of claim 1, said deriving step comprising the step of integrating the difference signal to provide an integrated signal from which the second delta modulated signal is derived.

3. The method of claim 2 wherein the integrating step is performed by analog means.

4. The method of claim 3, said deriving step further comprising the steps of:
   comparing the integrated signal to a preset signal level;
   sampling and storing the result of the comparison to provide the second delta modulated signal.

5. The method of claim 2, wherein the integrating step is performed digitally.

6. The method of claim 5, said deriving step further comprising the step of quantizing the integrated signal to provide the second delta modulated signal.

7. The method of claim 1, wherein the difference signal providing step includes the following steps:
   integrating the first delta modulated signal to provide a pulse code modulated first digital signal;
   integrating the second delta modulated signal to provide a pulse code modulated second digital signal; and
   subtractively combining the first and second digital signals to provide the pulse code modulated difference signal.

8. The method of claim 1, wherein the difference signal assumes up to nine different values.

9. The method of claim 7, wherein said deriving step derives the second delta modulated signal by quantizing the difference signal.

10. An apparatus for converting a first delta modulated signal with a first bit rate into a second delta modulated signal with a second bit rate, said apparatus comprising:
    an adding circuit for providing a difference signal by subtractively combining a first digital signal consisting of or derived from the first delta modulated signal and a second digital signal consisting of or derived from the second delta modulated signal; and
    means for deriving the second delta modulated signal from the difference signal.

11. The apparatus of claim 10, wherein the deriving means includes an integration circuit for integrating the difference signal.

12. The apparatus of claim 11, wherein the integration circuit is analog.

13. The apparatus of claim 12, said deriving means further comprising:
    a comparator for comparing the output of the integration circuit with a preset signal level; and
    a sampling and storage circuit for sampling and storing the result of the comparison to provide the second delta modulated signal.

14. The apparatus of claim 11, wherein the integration circuit is digital.

15. The apparatus of claim 14, said deriving means further comprising a one bit quantizing circuit for quantizing the output of the integration circuit.

16. Apparatus according to claim 10, wherein the second digital signal is, or is derived from, the second delta modulated signal applied in a negative feedback loop to the adding circuit.

17. Apparatus according to claim 16, further comprising:
    a first digital integration filter for converting the first delta modulation signal into a first pulse code modulated signal at a first sampling rate corresponding to the first bit rate;
    a second digital integration filter for converting the second delta modulation signal into a second pulse code modulated signal at a second sampling rate substantially corresponding to the second bit rate; and
    a sampling rate converter for converting the first pulse code modulated signal from the first sampling rate to said second sampling rate substantially corresponding to the second bit rate, or for converting the second pulse code modulated signal from the second sampling rate to the first sampling rate, wherein the adding circuit provides the difference signal at substantially the second sampling rate.

18. The apparatus of claims 10, 11, 12, 14, 15 or 16 further comprising a synchronization and weighting circuit which evaluates the increments of the first delta modulated signal on a time grid corresponding to the bit rate of the second delta modulated signal and weights the amplitude of the first delta modulated signal according to the bit rate of the second delta modulated signal.

19. The apparatus of claim 18, wherein the adding circuit is capable of storing the first digital signal until it receives the second digital signal.

20. The apparatus of claims 10, 11, 12, 14, 15 or 16 further comprising a first and a second synchronization and weighting circuit which normalizes respectively the increments of the first and second delta modulated signal on a time grid corresponding to the second bit rate and weights the amplitude of the first and second delta modulated signal according to the second bit rate to provide normalized first and second digital signals to the adding circuit.

21. The apparatus of claim 20, wherein the adding circuit is capable of storing first digital signal unit it receives the second digital signal.

22. The apparatus of claims 10, 11, 12, 14, 15 or 16 wherein said adding circuit evaluates the increments of the first delta modulated signal on a time grid corresponding to the bit rate of the second delta modulated signal and weights the amplitude of the first delta modulated signal according to the bit rate of the second delta modulated signal, and adds the weighted amplitude of the first delta modulated signal to the amplitude of the second delta modulated signal on the time grid corresponding to the bit rate of the second delta modulated signal.

23. The apparatus of claim 10, wherein the difference signal assumes up to nine different values.

* * * * *

UNITED STATES PATENT AND TRADEMARK OFFICE
CERTIFICATE OF CORRECTION

PATENT NO. : 4,630,007

DATED : Dec. 16, 1986

INVENTOR(S) : Lagadec

It is certified that error appears in the above-identified patent and that said Letters Patent is hereby corrected as shown below:

Col. 7, line 31: insert --,-- after "claim 2";

Col. 8, line 64: insert --the-- after "storing" and "unit" should be --until--.

Signed and Sealed this

Third Day of March, 1987

Attest:

DONALD J. QUIGG

Attesting Officer

Commissioner of Patents and Trademarks

UNITED STATES PATENT AND TRADEMARK OFFICE
CERTIFICATE OF CORRECTION

PATENT NO. : 4,630,007

DATED : Dec. 16, 1986

INVENTOR(S) : Lagadec

It is certified that error appears in the above-identified patent and that said Letters Patent is hereby corrected as shown below:

Col. 8, line 44, delete "12," and
        line 54, delete "12,".

Signed and Sealed this

Twenty-eighth Day of November 1989

Attest:

JEFFREY M. SAMUELS

*Attesting Officer*   *Acting Commissioner of Patents and Trademarks*